(12) United States Patent
Su

(10) Patent No.: US 8,950,718 B2
(45) Date of Patent: Feb. 10, 2015

(54) SUPPORT MODULE AND SUPPORT DEVICE HAVING MULTIPLE DEGREES OF FREEDOM

(71) Applicant: Flytech Technology Co., Ltd., Taipei (TW)

(72) Inventor: Kuan-Ming Su, Taipei (TW)

(73) Assignee: Flytech Technology Co., Ltd., Taipei (TW)

( * ) Notice: Subject to any disclaimer, the term of this patent is extended or adjusted under 35 U.S.C. 154(b) by 142 days.

(21) Appl. No.: 13/803,801

(22) Filed: Mar. 14, 2013

(65) Prior Publication Data
US 2014/0268510 A1 Sep. 18, 2014

(51) Int. Cl.
*A47F 5/00* (2006.01)
*H05K 7/16* (2006.01)
(52) U.S. Cl.
CPC .............. *H05K 7/16* (2013.01); *Y10S 248/919* (2013.01)
USPC ..................... 248/309.1; 248/919; 361/679.21
(58) Field of Classification Search
USPC ......... 248/138, 139, 917, 918, 919, 921, 922, 248/923; 361/679.21
See application file for complete search history.

(56) References Cited

U.S. PATENT DOCUMENTS

| | | | |
|---|---|---|---|
| 7,513,474 B2 * | 4/2009 | Anderson et al. | 248/284.1 |
| 7,701,699 B2 * | 4/2010 | Ma | 361/679.21 |
| 7,762,504 B2 * | 7/2010 | Chih | 248/125.8 |
| 8,020,816 B2 * | 9/2011 | Laitila et al. | 248/125.7 |
| 8,056,870 B2 * | 11/2011 | Chih et al. | 248/157 |
| 8,705,228 B2 * | 4/2014 | Chuang et al. | 361/679.21 |
| 2007/0146987 A1 * | 6/2007 | Sakata et al. | 361/683 |
| 2008/0093528 A1 * | 4/2008 | Tsai et al. | 248/917 |

FOREIGN PATENT DOCUMENTS

WO WO0044852 A1 * 8/2000 ............... B60D 1/04

* cited by examiner

*Primary Examiner* — Gwendolyn Baxter
(74) *Attorney, Agent, or Firm* — Rosenberg, Klein & Lee

(57) ABSTRACT

A support device having multiple degrees of freedom includes a base unit, a first support unit, a second support unit and a hinge unit. The base unit includes a base body. The first support unit includes a first support structure disposed on the base body. The second support unit includes a second support structure disposed between the first support structure and at least one display. The hinge unit includes a first hinge structure connected between the first support structure and a first end of the second support structure and a second hinge structure connected between a second end of the second support structure and the at least one display. Therefore, the second support structure can be pivotally disposed on the first support structure through the first hinge structure, and the at least one display can be pivotally disposed on the second support structure through the second hinge structure.

10 Claims, 8 Drawing Sheets

SUPPORT MODULE AND SUPPORT DEVICE HAVING MULTIPLE DEGREES OF FREEDOM

BACKGROUND OF THE INVENTION

1. Field of the Invention

The instant disclosure relates to a support module and a support device, and more particularly to a support module and a support device having multiple degrees of freedom.

2. Description of Related Art

Because LCDs are thin, light, and small, and consume a small amount of power, LCDs are widely applied to information apparatus. In order to allow a user to view the display at the best possible viewing angle, there is a hinge assembly between the display panel and the base of the LCD. The hinge assembly can support the LCD and allows the viewing angle to be adjusted.

The prior art disclosures a hinge assembly including a connecting base, a bottom board, a rotating element, and two locking elements. The connecting base is a U-shaped board. The bottom of the connecting base is connected with the bottom board via a plurality of screws. Therefore, the connecting base utilizes the bottom board to connect to the base of the LCD. Ear parts and extend from two sides of the connecting base and the rotating element respectively. The two locking elements insert within the two ear parts of the connecting base respectively, the two ear parts of the rotating element and a plurality of washers, and are fastened to the locking element via the nuts. Therefore, the connecting base is pivoted to the rotating element. The display panel of the LCD is connected to the rotating element so that the display panel is pivoted to the base via the hinge assembly. Thereby, the display panel can be adjusted forwards and backwards. However, the hinge assembly of the prior art needs a bottom board to be installed in the bottom of the connecting base, and a plurality of screws are required to connect the connecting base and the bottom board. The structure is complex, the quantity of required elements is large, and the cost of the materials is high. Besides, the assembling tolerance is large, and the yield rate is low.

Further, the prior art discloses a supporting apparatus for a display. The supporting apparatus includes a body and two supporting frames. The body has two ear parts. Each of the ear parts has a through hole. The side wall of at least one of the through holes has a thread. Each of the supporting frames has a fastening shaft. On an outside surface of at least one fastening shaft, there is a thread corresponding to the thread of the side wall of the through hole. The fastening shafts insert within the through holes respectively. The supporting apparatus for a display further includes a plurality of washers and board-shaped springs. The washers and the board-shaped springs are respectively located at the fastening shafts. Two sides of the board-shaped springs respectively lean against the washers and the ear parts.

SUMMARY OF THE INVENTION

One aspect of the instant disclosure relates to a support module and a support device having multiple degrees of freedom.

One of the embodiments of the instant disclosure provides a support module having multiple degrees of freedom for supporting at least one display, comprising: a first support unit, a second support unit and a hinge unit. The first support unit includes a first support structure disposed on a base body. The second support unit includes a second support structure disposed between the first support structure and the at least one display. The hinge unit includes a first hinge structure connected between the first support structure and a first end of the second support structure and a second hinge structure connected between a second end of the second support structure and the at least one display, wherein the second support structure is pivotally disposed on the first support structure through the first hinge structure, and the at least one display is pivotally disposed on the second support structure through the second hinge structure.

Another one of the embodiments of the instant disclosure provides a support device having multiple degrees of freedom for supporting at least one display, comprising: a base unit, a first support unit, a second support unit and a hinge unit. The base unit includes a base body. The first support unit includes a first support structure disposed on the base body. The second support unit includes a second support structure disposed between the first support structure and the at least one display. The hinge unit includes a first hinge structure connected between the first support structure and a first end of the second support structure and a second hinge structure connected between a second end of the second support structure and the at least one display, wherein the second support structure is pivotally disposed on the first support structure through the first hinge structure, and the at least one display is pivotally disposed on the second support structure through the second hinge structure.

Yet another one of the embodiments of the instant disclosure provides a support device having multiple degrees of freedom, comprising: a base unit and a plurality of support modules. The base unit includes a base body. The support modules are sequentially stacked on top of one another and disposed on the base body, wherein each support module is used to support at least one display, and each support module comprises: a first support unit, a second support unit and a hinge unit. The first support unit includes a first support structure. The second support unit includes a second support structure disposed between the first support structure and the at least one display. The hinge unit includes a first hinge structure connected between the first support structure and a first end of the second support structure and a second hinge structure connected between a second end of the second support structure and the at least one display, wherein the second support structure is pivotally disposed on the first support structure through the first hinge structure, and the at least one display is pivotally disposed on the second support structure through the second hinge structure.

More precisely, the second support structure includes at least two second support frames respectively disposed on two opposite lateral sides of the first support structure, each second support frame has a first end portion and a second end portion opposite to the first end portion, the first hinge structure includes at least two first hinges separated from each other, the second hinge structure includes at least two second hinges separated from each other, the first end portion of each second support frame is pivotally disposed on the first support structure through each corresponding first hinge, and the second end portion of each second support frame is pivotally disposed on the at least one display through each corresponding second hinge, wherein the inclination angle of each second support frame relative to the first support structure and the height of each second hinge relative to a horizontal plane are adjusted through each corresponding first hinge, and the inclination angle of the at least one display relative to a horizontal line passing through the second hinge structure is adjusted through the at least two second hinges.

More precisely, the first support structure has a wire arrangement space formed therein and a wire arrangement opening communicated with the wire arrangement space, and both at least one conductive line and at least one signal line electrically connected to the at least one display are received in the wire arrangement space through the wire arrangement opening.

More precisely, the hinge unit includes a third hinge structure connected between the first support structure and the base body, the first support structure is pivotally disposed on the base body through the third hinge structure, and the first support structure is horizontally rotated relative to the base body by a predetermined angle through the third hinge structure.

Therefore, the second support structure can be pivotally disposed on the first support structure through the first hinge structure, thus when the second support structure is rotated relative to the first support structure by a predetermined angle through the first hinge structure, the at least one display can be simultaneously rotated according to the rotation of the second support structure. In addition, the at least one display can be pivotally disposed on the second support structure through the second hinge structure, thus the view angle of the at least one display relative to the second support structure can be adjusted through second hinge structure.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

First Embodiment

Figure 1:
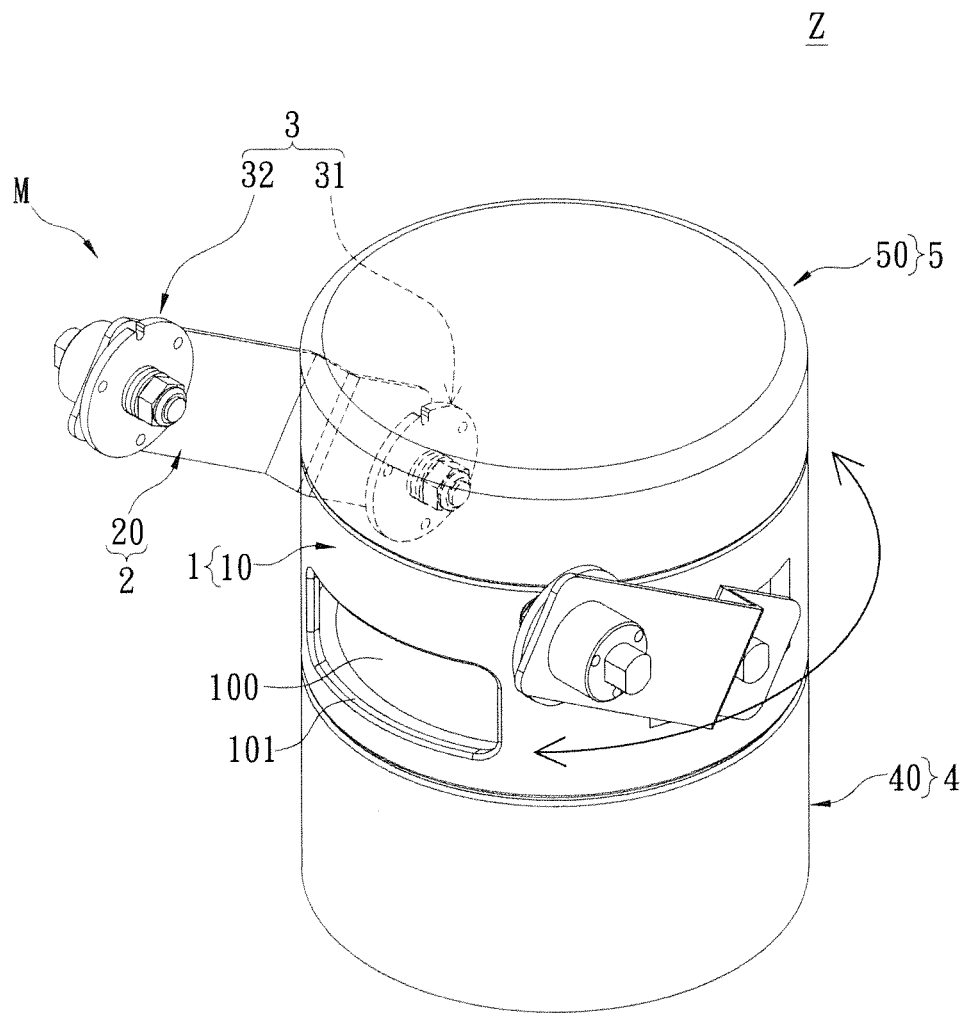
FIG. 1 shows a perspective, assembled, schematic view of the support device having multiple degrees of freedom according to the first embodiment of the instant disclosure.
Figure 2:
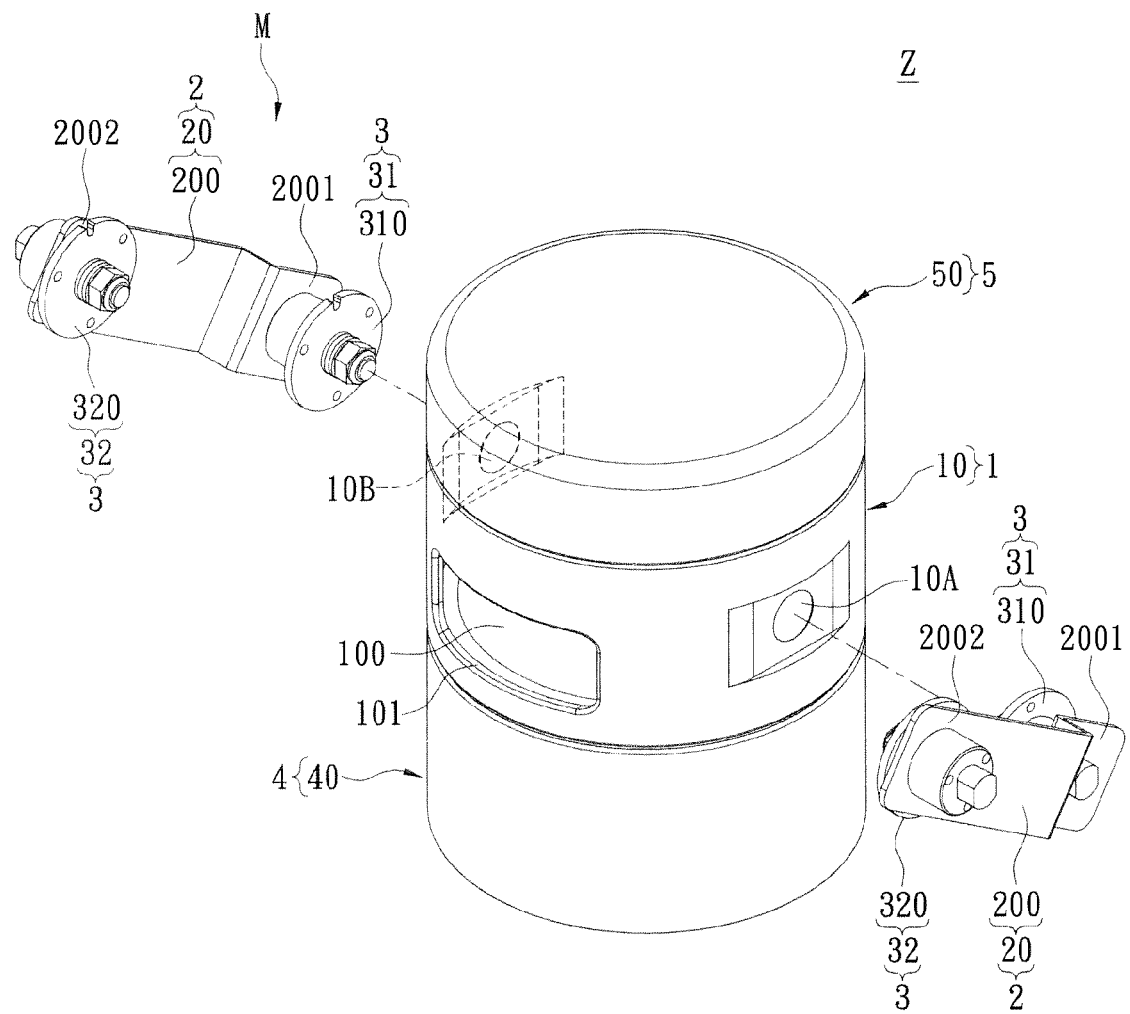
FIG. 2 shows a perspective, exploded, schematic view of the support device having multiple degrees of freedom according to the first embodiment of the instant disclosure.
Figure 3:
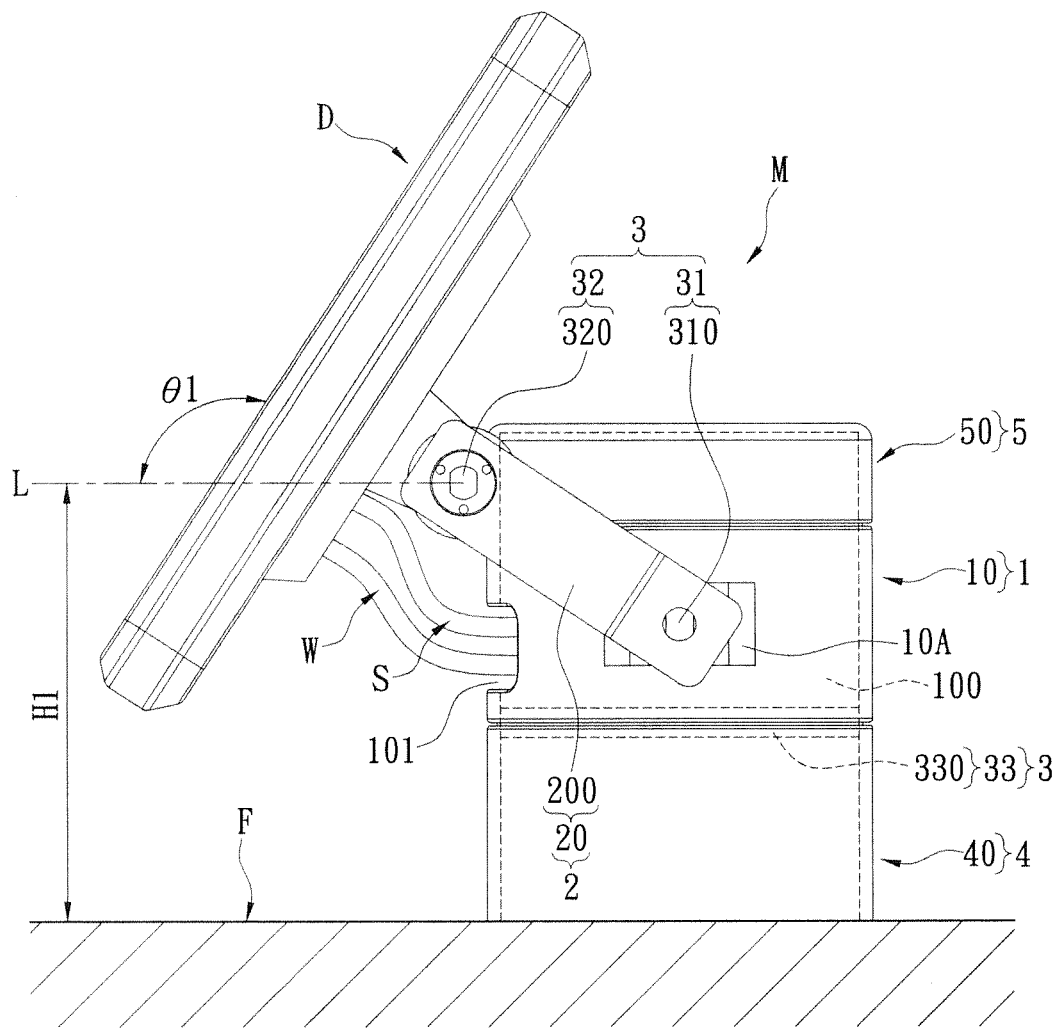
FIG. 3 shows a lateral, schematic view of the support device having multiple degrees of freedom according to the first embodiment of the instant disclosure.

Referring to FIG. 1 to FIG. 3, FIG. 1 is a perspective, assembled, schematic diagram, FIG. 2 is a perspective, exploded, schematic diagram, and FIG. 3 is a lateral, schematic diagram. The first embodiment of the instant disclosure provides a support device Z having multiple degrees of freedom for supporting at least one display D (as shown in FIG. 3), comprising: a first support unit 1, a second support unit 2, a hinge unit 3, a base unit 4 and a top cover unit 5, where the first support unit 1, the second support unit 2 and the hinge unit 3 can be combined to form a support module M.

First, the base unit 4 includes a base body 40, the first support unit 1 includes a first support structure 10 disposed on the base body 40, and the top cover unit 5 includes a top cover body 50 disposed on the first support structure 10. For example, the base body 40, the first support structure 10 and the top cover body 50 (such as three hollow columnar bodies) can be stacked on top of one another from bottom to top. In addition, the second support unit 2 includes a second support structure 20 disposed between the first support structure 10 and the at least one display D. The hinge unit 3 includes a first hinge structure 31 connected between the first support structure 10 and a first end of the second support structure 20 and a second hinge structure 32 connected between a second end of the second support structure 20 and the at least one display D. The second support structure 20 is pivotally disposed on the first support structure 10 through the first hinge structure 31, and the at least one display D is pivotally disposed on the second support structure 20 through the second hinge structure 32. Hence, when the second support structure 20 can be rotated relative to the first support structure 10 by a predetermined angle through the first hinge structure 31, the at least one display D can be simultaneously rotated according to the rotation of the second support structure 20. In addition, the view angle of the at least one display D relative to the second support structure 20 can be adjusted through second hinge structure 32.

More precisely, the second support structure 20 includes at least two second support frames 200 respectively disposed on two opposite lateral sides (10A, 10B) of the first support structure 10, and each second support frame 200 has a first end portion 2001 and a second end portion 2002 opposite to the first end portion 2001. In addition, the first hinge structure 31 includes at least two first hinges 310 separated from each other, and the at least two first hinges 310 are respectively corresponding to the two first end portions 2001 of the at least two second support frames 200 or the two opposite lateral sides (10A, 10B) of the first support structure 10. The second hinge structure 32 includes at least two second hinges 320 separated from each other, and the at least two second hinges 320 are respectively corresponding to the second end portions 2002 of the at least two second support frames 200 or two hinge portions (not shown) on the back of the at least one display D. Therefore, the first end portion 2001 of each second support frame 200 can be pivotally disposed on the first support structure 10 through each corresponding first hinge 310, thus the second support structure 20 and the at least one display D can be concurrently rotated relative to the first support structure 10 by a predetermined angle, and the second end portion 2002 of each second support frame 200 can be pivotally disposed on the at least one display D through each corresponding second hinge 320 for adjusting the view angle of the at least one display D relative to the second support structure 20.

Figure 4:
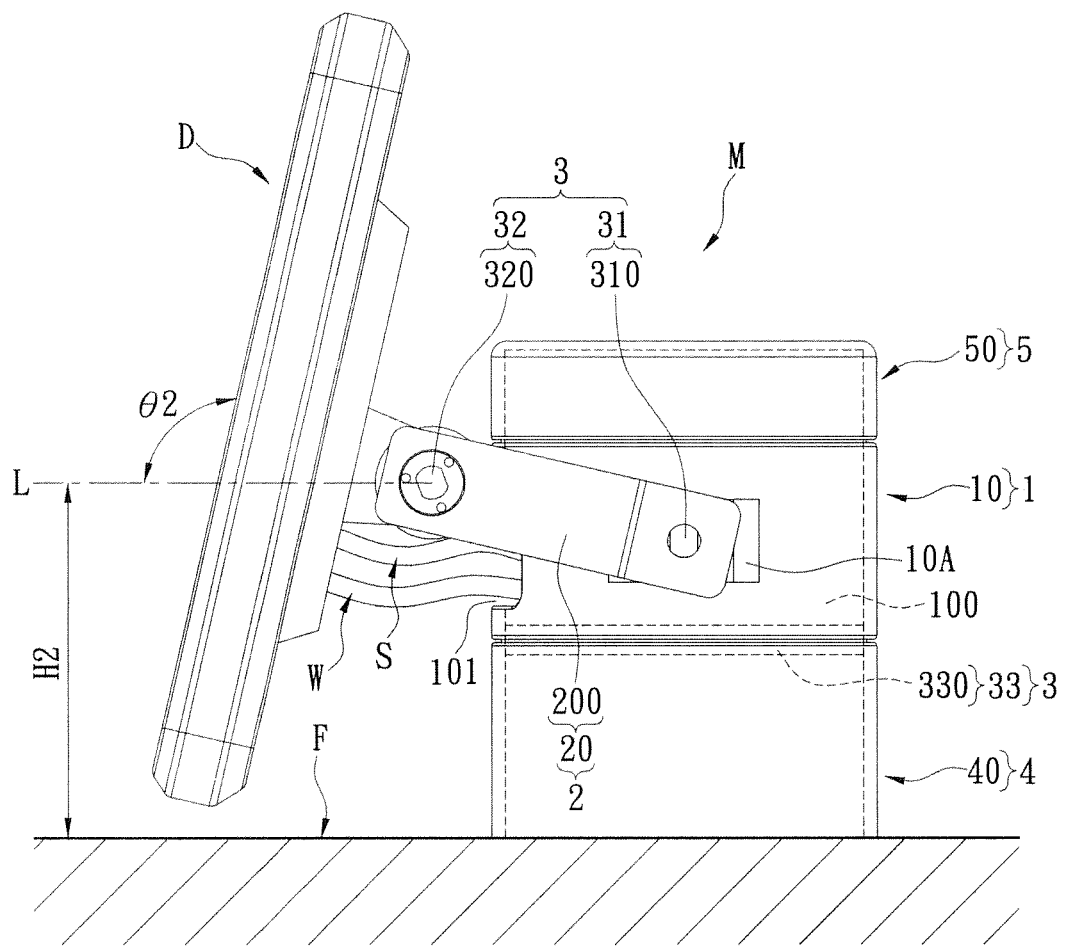
FIG. 4 shows another lateral, schematic view of the support device having multiple degrees of freedom according to the first embodiment of the instant disclosure.
Figure 5:
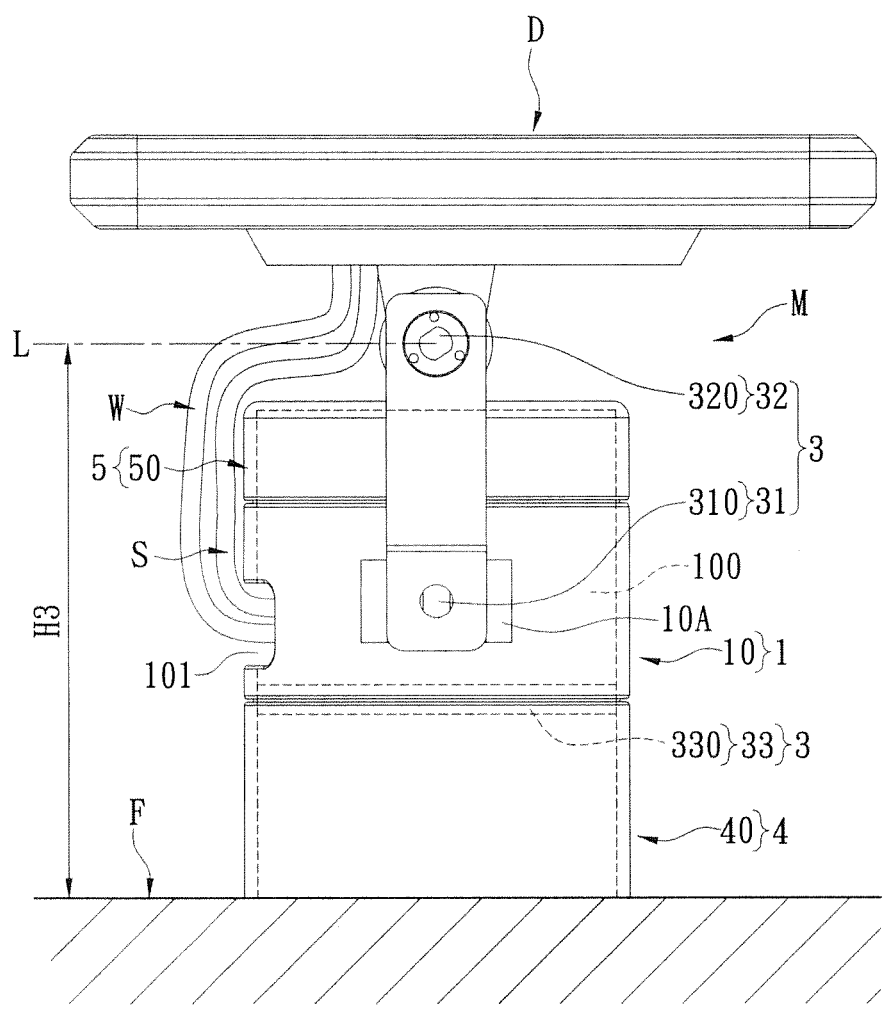
FIG. 5 shows yet another lateral, schematic view of the support device having multiple degrees of freedom according to the first embodiment of the instant disclosure.

Hence, referring to FIG. 3, the inclination angle of each second support frame 200 of the second support structure 20 relative to the first support structure 10 and the height H1 of the center point of each second hinge 320 relative to a horizontal plane F can be adjusted through each corresponding first hinge 310. In addition, the inclination angle θ1 of the at least one display D relative to a horizontal line L passing through the center point of the second hinge structure 32 can be adjusted through the at least two second hinges 320 of the second hinge structure 32. For example, referring to FIG. 3 and FIG. 4, the height of the center point of each second hinge 320 relative to the horizontal plane F can be adjusted from H1 (as shown in FIG. 3) to H2 (as shown in FIG. 4), and the inclination angle of the at least one display D relative to the horizontal line L passing through the center point of the second hinge structure 32 can be adjusted from θ1 (as shown in FIG. 3) to θ2 (as shown in FIG. 4). Moreover, referring to FIG. 5, when the inclination angle θ1 of the at least one display D relative to the horizontal line L passing through the center point of the second hinge structure 32 is equal to 180 degrees (i.e., the display screen of the at least one display D is horizontal to the horizontal line L), the height H3 of the center point of each second hinge 320 relative to the horizontal plane F is maximum, and the height H3 is larger than that of the assembly of the base body 40, the first support structure 10 and the top cover body 50.

It's worth mentioning that the first support structure 10 has a wire arrangement space 100 formed therein and a wire arrangement opening 101 communicated with the wire arrangement space 100, and both at least one conductive line W and at least one signal line S electrically connected to the at least one display D are received in the wire arrangement space 100 through the wire arrangement opening 101. Hence, the at least one conductive line W and the at least one signal line S can be arranged by matching the wire arrangement space 100 and the wire arrangement opening 101 in order to enhance the aspect of the instant disclosure.

Furthermore, the hinge unit 3 further includes a third hinge structure 33 connected between the first support structure 10 and the base body 40, and the third hinge structure 33 may be a rotatable swivel hinge 330. In addition, the first support structure 10 can be pivotally disposed on the base body 40 through the third hinge structure 33, thus when the first support structure 10 can be horizontally rotated relative to the base body 40 by a predetermined angle through the third hinge structure 33 (shown as the two-way arrow in FIG. 1), the at least one display D can be rotated according to the rotation of the first support structure 10. In other words, the view angle of the at least one display D can be adjusted freely by matching the first hinge structure 31, the second hinge structure 32 and the third hinge structure 33.

Second Embodiment

Figure 6:
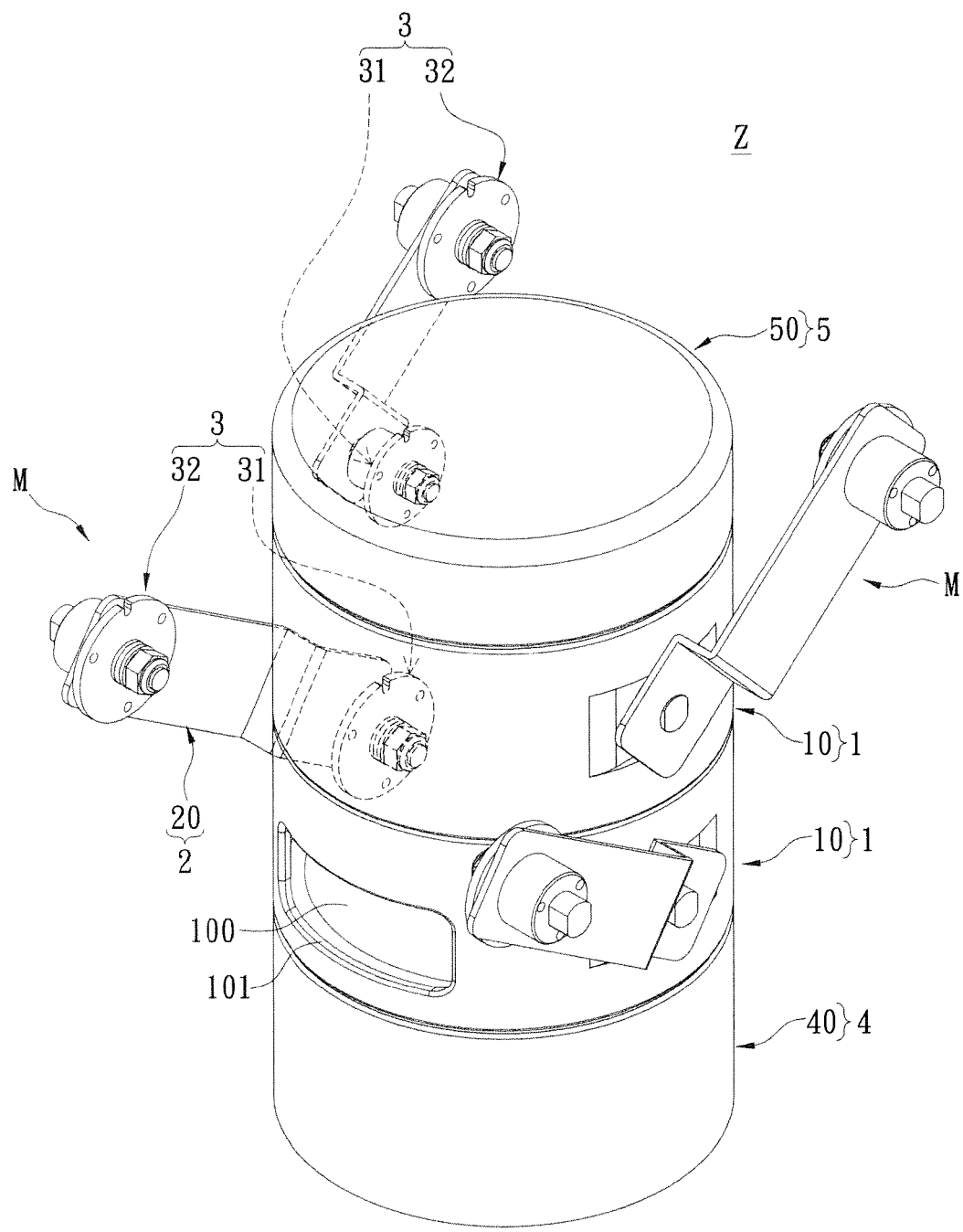
FIG. 6 shows a perspective, assembled, schematic view of the support device having multiple degrees of freedom according to the second embodiment of the instant disclosure.
Figure 7:
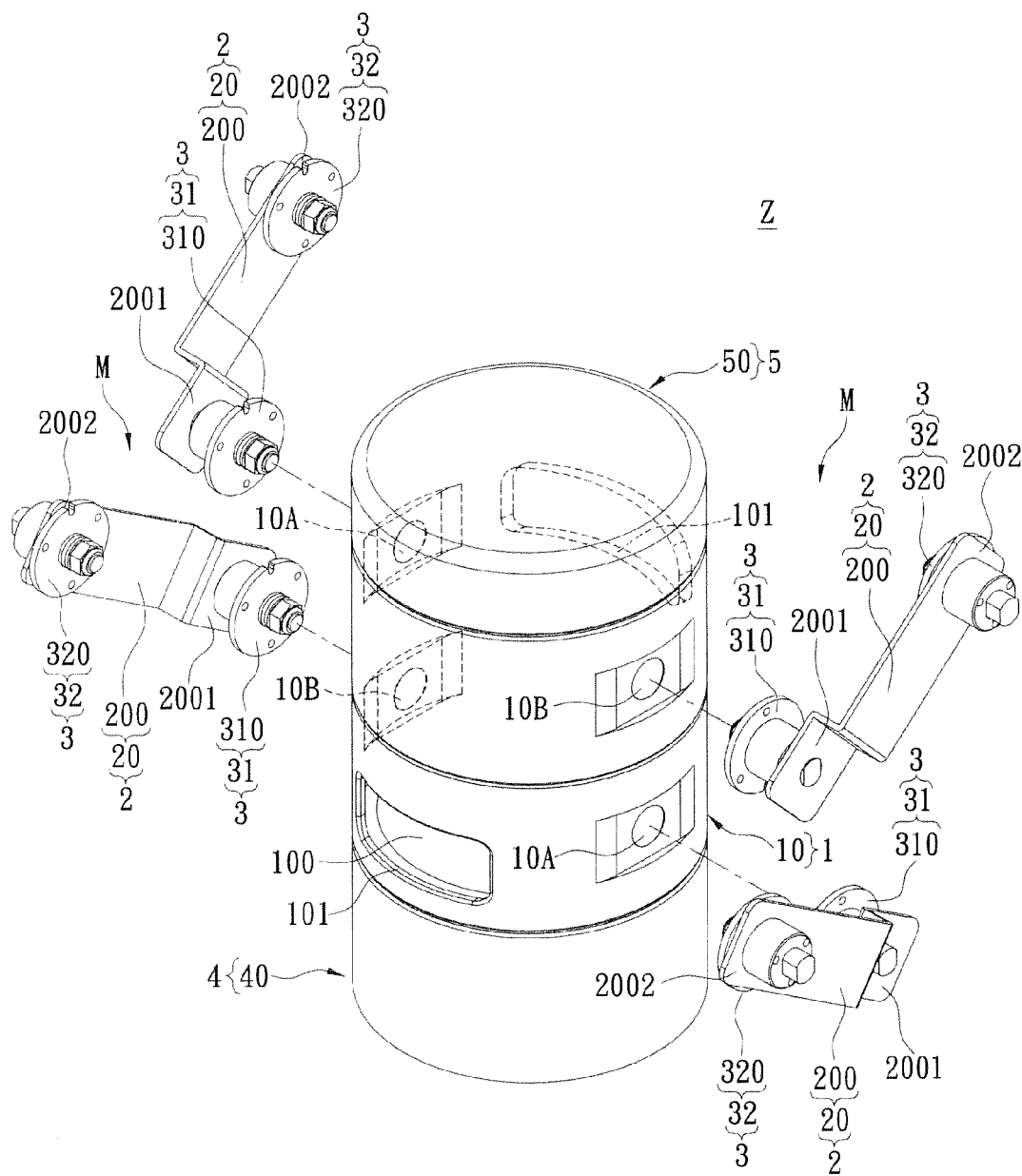
FIG. 7 shows a perspective, exploded, schematic view of the support device having multiple degrees of freedom according to the second embodiment of the instant disclosure.
Figure 8:
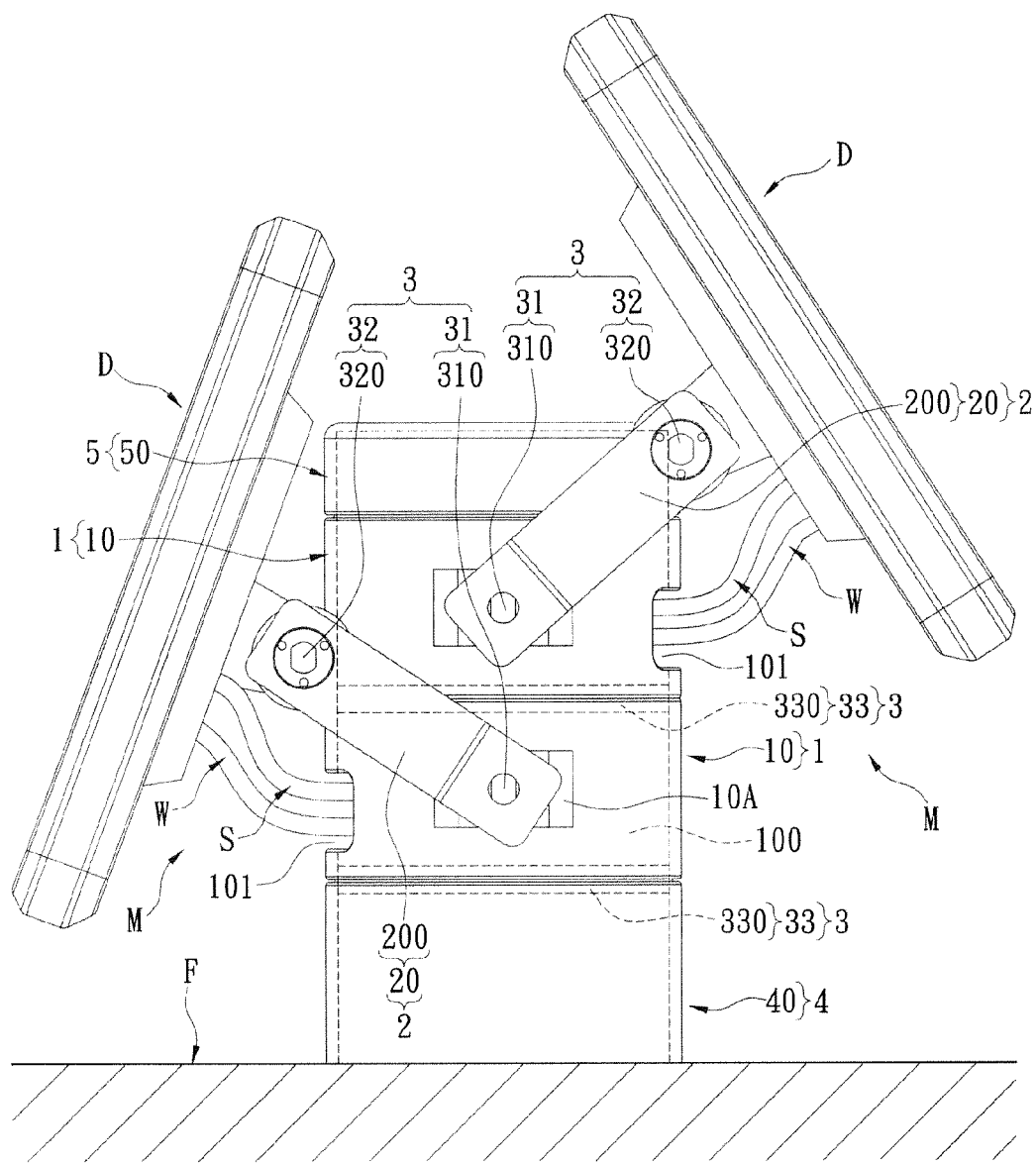
FIG. 8 shows a lateral, schematic view of the support device having multiple degrees of freedom according to the second embodiment of the instant disclosure.

Referring to FIG. 6 to FIG. 8, FIG. 6 is a perspective, assembled, schematic diagram, FIG. 7 is a perspective, exploded, schematic diagram, and FIG. 8 is a lateral, schematic diagram. The second embodiment of the instant disclosure provides a support device Z having multiple degrees of freedom, comprising: a base unit 4, a plurality of support modules M and a top cover unit 5, and each support module M can be used to support at least one display D.

More precisely, each support module M includes a first support unit 1, a second support unit 2 and a hinge unit 3. The first support unit 1 includes a first support structure 10. The second support unit 2 includes a second support structure 20 disposed between the first support structure 10 and the at least one display D. The hinge unit 3 includes a first hinge structure 31 connected between the first support structure 10 and a first end of the second support structure 20 and a second hinge structure 32 connected between a second end of the second support structure 20 and the at least one display D. The second support structure 20 can be pivotally disposed on the first support structure 10 through the first hinge structure 31, and the at least one display D can be pivotally disposed on the second support structure 20 through the second hinge structure 32. In addition, the base unit 4 includes a base body 40, and the support modules M can be sequentially stacked on top of one another and disposed on the base body 4. The first support structure 10 of the bottommost support module M is directly disposed on the base body 40, and the top cover unit 5 includes a top cover body 50 disposed on the first support structure of the topmost support module M. Hence, when the second support structure 20 is rotated relative to the first support structure 10 by a predetermined angle through the first hinge structure 31, the at least one display D can be simultaneously rotated according to the rotation of the second support structure 20. In addition, the view angle of the at least one display D relative to the second support structure 20 can be adjusted through second hinge structure 32.

More precisely, the second support structure 20 includes at least two second support frames 200 respectively disposed on two opposite lateral sides (10A, 10B) of the first support structure 10, and each second support frame 200 has a first end portion 2001 and a second end portion 2002 opposite to the first end portion 2001. In addition, the first hinge structure 31 includes at least two first hinges 310 separated from each other, and the at least two first hinges 310 are respectively corresponding to the two first end portions 2001 of the at least two second support frames 200 or the two opposite lateral sides (10A, 10B) of the first support structure 10. The second hinge structure 32 includes at least two second hinges 320 separated from each other, and the at least two second hinges 320 are respectively corresponding to the second end portions 2002 of the at least two second support frames 200 or two hinge portions (not shown) on the back of the at least one display D. Therefore, the first end portion 2001 of each second support frame 200 can be pivotally disposed on the first support structure 10 through each corresponding first hinge 310, thus the second support structure 20 and the at least one display D can be concurrently rotated relative to the first support structure 10 by a predetermined angle, and the second end portion 2002 of each second support frame 200 can be pivotally disposed on the at least one display D through each corresponding second hinge 320 for adjusting the view angle of the at least one display D relative to the second support structure 20.

It's worth mentioning that the first support structure 10 has a wire arrangement space 100 formed therein and a wire arrangement opening 101 communicated with the wire arrangement space 100, and both at least one conductive line W and at least one signal line S electrically connected to the at least one display D are received in the wire arrangement space 100 through the wire arrangement opening 101. Hence, the at least one conductive line W and the at least one signal line S can be arranged by matching the wire arrangement space 100 and the wire arrangement opening 101 in order to enhance the aspect of the instant disclosure.

Furthermore, the hinge unit 3 further includes a third hinge structure 33 connected between the first support structure 10 and the base body 40, and the third hinge structure 33 may be a rotatable swivel hinge 330. In addition, the first support structure 10 can be pivotally disposed on the base body 40 through the third hinge structure 33, thus when the first support structure 10 can be horizontally rotated relative to the base body 40 by a predetermined angle through the third hinge structure 33 (shown as the two-way arrow in FIG. 1), the at least one display D can be rotated according to the rotation of the first support structure 10. In other words, the view angle of the at least one display D can be adjusted freely by matching the first hinge structure 31, the second hinge structure 32 and the third hinge structure 33.

In a word, the difference between the second embodiment and the first embodiment is as follows: the first embodiment uses only one support module M disposed on the base body 40, and the second embodiment uses more than one support module M sequentially stacked on the base body 40.

In conclusion, the second support structure 20 can be pivotally disposed on the first support structure 10 through the first hinge structure 31, thus when the second support structure 20 is rotated relative to the first support structure 10 by a predetermined angle through the first hinge structure 31, the at least one display D can be simultaneously rotated according to the rotation of the second support structure 20. In addition, the at least one display D can be pivotally disposed on the second support structure 20 through the second hinge structure 32, thus the view angle of the at least one display D relative to the second support structure 20 can be adjusted through second hinge structure 32.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A support module having multiple degrees of freedom for supporting at least one display, comprising:
   a first support unit including a first support structure disposed on a base body;
   a second support unit including a second support structure disposed between the first support structure and the at least one display; and
   a hinge unit including a first hinge structure connected between the first support structure and a first end of the second support structure and a second hinge structure connected between a second end of the second support structure and the at least one display, wherein the second support structure is pivotally disposed on the first support structure through the first hinge structure, and the at least one display is pivotally disposed on the second support structure through the second hinge structure.

2. The support module of claim 1, wherein the second support structure includes at least two second support frames respectively disposed on two opposite lateral sides of the first support structure, each second support frame has a first end portion and a second end portion opposite to the first end portion, the first hinge structure includes at least two first hinges separated from each other, the second hinge structure includes at least two second hinges separated from each other, the first end portion of each second support frame is pivotally disposed on the first support structure through each corresponding first hinge, and the second end portion of each second support frame is pivotally disposed on the at least one display through each corresponding second hinge, wherein the inclination angle of each second support frame relative to the first support structure and the height of each second hinge relative to a horizontal plane are adjusted through each corresponding first hinge, and the inclination angle of the at least one display relative to a horizontal line passing through the second hinge structure is adjusted through the at least two second hinges.

3. The support module of claim 1, wherein the first support structure has a wire arrangement space formed therein and a wire arrangement opening communicated with the wire arrangement space, and both at least one conductive line and at least one signal line electrically connected to the at least one display are received in the wire arrangement space through the wire arrangement opening.

4. The support module of claim 1, wherein the hinge unit includes a third hinge structure connected between the first support structure and the base body, the first support structure is pivotally disposed on the base body through the third hinge structure, and the first support structure is horizontally rotated relative to the base body by a predetermined angle through the third hinge structure.

5. A support device having multiple degrees of freedom for supporting at least one display, comprising:
   a base unit including a base body;
   a first support unit including a first support structure disposed on the base body;
   a second support unit including a second support structure disposed between the first support structure and the at least one display; and
   a hinge unit including a first hinge structure connected between the first support structure and a first end of the second support structure and a second hinge structure connected between a second end of the second support structure and the at least one display, wherein the second support structure is pivotally disposed on the first support structure through the first hinge structure, and the at least one display is pivotally disposed on the second support structure through the second hinge structure.

6. The support device of claim 5, wherein the second support structure includes at least two second support frames respectively disposed on two opposite lateral sides of the first support structure, each second support frame has a first end portion and a second end portion opposite to the first end portion, the first hinge structure includes at least two first hinges separated from each other, the second hinge structure includes at least two second hinges separated from each other, the first end portion of each second support frame is pivotally disposed on the first support structure through each corresponding first hinge, and the second end portion of each second support frame is pivotally disposed on the at least one display through each corresponding second hinge, wherein an inclination angle of each second support frame relative to the first support structure and the height of each second hinge relative to a horizontal plane are adjusted through each corresponding first hinge, and the inclination angle of the at least one display relative to a horizontal line passing through the second hinge structure is adjusted through the at least two second hinges.

7. A support device having multiple degrees of freedom, comprising:
   a base unit including a base body; and
   a plurality of support modules sequentially stacked on top of one another and disposed on the base body, wherein each support module is used to support at least one display, and said each support module comprises:
   a first support unit including a first support structure;
   a second support unit including a second support structure disposed between the first support structure and the at least one display; and
   a hinge unit including a first hinge structure connected between the first support structure and a first end of the second support structure and a second hinge structure connected between a second end of the second support structure and the at least one display, wherein the second support structure is pivotally disposed on the first support structure through the first hinge structure, and the at least one display is pivotally disposed on the second support structure through the second hinge structure.

8. The support device of claim 7, wherein the second support structure includes at least two second support frames respectively disposed on two opposite lateral sides of the first support structure, each second support frame has a first end portion and a second end portion opposite to the first end portion, the first hinge structure includes at least two first hinges separated from each other, the second hinge structure includes at least two second hinges separated from each other, the first end portion of each second support frame is pivotally disposed on the first support structure through each corresponding first hinge, and the second end portion of each second support frame is pivotally disposed on the at least one display through each corresponding second hinge, wherein an inclination angle of each second support frame relative to the first support structure and the height of each second hinge relative to a horizontal plane are adjusted through said corresponding first hinge, and the inclination angle of the at least one display relative to a horizontal line passing through the second hinge structure is adjusted through the at least two second hinges.

9. The support device of claim 7, wherein the first support structure has wire arrangement space formed therein and a wire arrangement opening communicated with the wire arrangement space, and both at least one conductive line and at least one signal line electrically connected to the at least one display are received in the wire arrangement space through the wire arrangement opening.

10. The support device of claim 7, wherein the hinge unit includes a third hinge structure connected between the first support structure and the base body, the first support structure is pivotally disposed on the base body through the third hinge structure, and the first support structure is horizontally rotated relative to the base body by a predetermined angle through the third hinge structure.

* * * * *